(12) United States Patent
Hsu et al.

(10) Patent No.: US 7,323,911 B2
(45) Date of Patent: Jan. 29, 2008

(54) DIFFERENTIAL SENSE AMPLIFIER CIRCUIT AND METHOD TRIGGERED BY A CLOCK SIGNAL THROUGH A SWITCH CIRCUIT

(75) Inventors: Jer Hao Hsu, Changhua (TW); Tein Yen Wang, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 44 days.

(21) Appl. No.: 11/285,526

(22) Filed: Nov. 21, 2005

(65) Prior Publication Data

US 2007/0115031 A1    May 24, 2007

(51) Int. Cl.
G11C 7/06    (2006.01)
(52) U.S. Cl. ......................... 327/57; 327/211
(58) Field of Classification Search ................. 327/51, 327/52, 54, 57
See application file for complete search history.

(56) References Cited

U.S. PATENT DOCUMENTS

| | | | | |
|---|---|---|---|---|
| 5,140,179 A | * | 8/1992 | Takano | 327/203 |
| 5,506,524 A | * | 4/1996 | Lin | 327/57 |
| 5,526,314 A | | 6/1996 | Kumar | |
| 5,625,308 A | * | 4/1997 | Matsumoto et al. | 327/203 |
| 5,903,171 A | * | 5/1999 | Shieh | 327/55 |
| 6,154,064 A | | 11/2000 | Proebsting | |
| 6,566,927 B2 | * | 5/2003 | Park et al. | 327/211 |
| 6,683,479 B2 | * | 1/2004 | Engl | 327/52 |
| 6,756,823 B1 | | 6/2004 | Chen et al. | |
| 7,187,207 B2 | * | 3/2007 | Rowley | 326/83 |
| 2002/0135401 A1 | * | 9/2002 | Watarai | 327/55 |
| 2002/0153936 A1 | * | 10/2002 | Zerbe | 327/336 |
| 2004/0217812 A1 | * | 11/2004 | Jaussi et al. | 330/253 |

\* cited by examiner

*Primary Examiner*—Kenneth B. Wells
*Assistant Examiner*—Ryan C. Jager
(74) *Attorney, Agent, or Firm*—Haynes Beffel & Wolfeld LLP (57) ABSTRACT

A differential sense amplifier is described that can be configured as a preamplifier or a latch circuit as triggered by a clock signal connected to a switch circuit. When the clock signal is set at a first signal level, the switch circuit in the differential sense amplifier is activated so that the differential sense amplifier is configured as a preamplifier with a positive feedback circuit. When the clock signal is set at a second signal level, the switch circuit in the differential sense amplifier is deactivated so that the differential sense amplifier is configured as the latch circuit. For one read cycle, the differential sense amplifier operates first as the preamplifier and then as the latch circuit.

8 Claims, 6 Drawing Sheets

DIFFERENTIAL SENSE AMPLIFIER CIRCUIT AND METHOD TRIGGERED BY A CLOCK SIGNAL THROUGH A SWITCH CIRCUIT

BACKGROUND OF THE INVENTION

1. Field of the Invention

The present invention relates generally to integrated circuits and more particularly to differential sense amplifiers that functions as a preamplifier and a latch circuit.

2. Description of Related Art

Sense amplifiers are typically used to read the state ("0" or "1") of memory cells in memory arrays, such as read-only memory (ROM) arrays. A ROM array may contain millions of memory cells arranged in rows and columns. The sources of each cell in a column may be connected to a source-column line, and the source-column line for a selected cell may be connected to a reference potential or ground during reading of the selected cell by a sense amplifier. The drains of each cell in a column are connected to a separate bit-line (drain-column line), and the drain-column line for a selected cell is connected to the input of the sense amplifier during reading of the selected cell. The control gates of each cell in a row are connected to a word line, and the word line for a selected cell is connected to the predetermined select voltage during reading of the selected cell.

During the read operation, the current through the selected cell is compared with a reference current to determine whether or not the selected cell is programmed with a "0" or a "1". The reference circuitry is connected to the input of a first current-sensing amplifier. The output of the first current-sensing amplifier is connected to one side of a differential amplifier. The differential amplifier compares the voltage output of the first current-sensing amplifier with the voltage output of a second sensing amplifier connected to the selected memory cell being read. If the reference-circuitry comprises a memory cell that is essentially the same as the memory cell being read, it is generally necessary to unbalance the current-sensing amplifiers in order to arrive at a reference current between the current of selected cells programmed with a "0" and the current of selected cell programmed with a "1."

Problems associated with prior art sense amplifiers include sensitivity to noise, the speed is limited by slew rate, and a kickback noise is generated at input during the transitioning from low to high in a clock signal. Accordingly, it is desirable to design a differential sense amplifier that enhances a memory read margin, reduces kickback noise, and increases speed performance.

SUMMARY OF THE INVENTION

The present invention provides a differential sense amplifier that can be configured as a preamplifier or a latch circuit as triggered by a clock signal connected to a switch circuit. When the clock signal is set at a first signal level, the switch circuit in the differential sense amplifier is activated so that the differential sense amplifier is configured as a preamplifier with a positive feedback circuit. When the clock signal is set at a second signal level, the switch circuit in the differential sense amplifier is deactivated so that the differential sense amplifier is configured as the latch circuit. For one read cycle, the differential sense amplifier operates first as the preamplifier and then as the latch circuit.

In a first embodiment, the differential sense amplifier has a switch circuit that is coupled to a pair of diode-connected transistors on the upper side and a differential pair on the lower side with a positive feedback circuit. In a second embodiment, the differential sense amplifier has a switch circuit that is coupled to a pair of resistors on the upper side and a differential pair on the lower side with a positive feedback circuit. In a third embodiment, the differential sense amplifier has a switch that is coupled to a differential pair on the upper side and a pair of diode-connected transistors on the lower side with a positive feedback circuit.

Broadly stated, a differential sense amplifier comprises a transistor (M3) having a first conduction terminal, a control terminal, and a second conduction terminal; a transistor (M4) having a first conduction terminal, a control terminal, and a second conduction terminal, the control terminal of the M3 transistor connected to the control terminal of the M4 transistor; and a clock signal connected between the control terminal of the M3 transistor and the control terminal of the M4 transistor, the clock signal having a first signal level and a second signal level, the differential sense amplifier configuring as an amplifier when the clock signal is asserted to the first signal level, the differential sense amplifier configuring as a latch circuit when the clock signal is asserted to the second signal level.

Advantageously, the present invention comprises differential inputs, a latch circuit, and a pair of diode-connected transistors that provide stable amplification. Moreover, the present invention advantageously amplifies a differential input signal before a latch is enabled. Furthermore, the present invention advantageously increases the speed of regeneration with a positive feedback circuit.

The structures and methods regarding to the present invention are disclosed in the detailed description below. This summary does not purport to define the invention. The invention is defined by the claims. These and other embodiments, features, aspects, and advantages of the invention will become better understood with regard to the is following description, appended claims and accompanying drawings.

DETAILED DESCRIPTION OF EMBODIMENTS OF THE INVENTION

Figure 1:
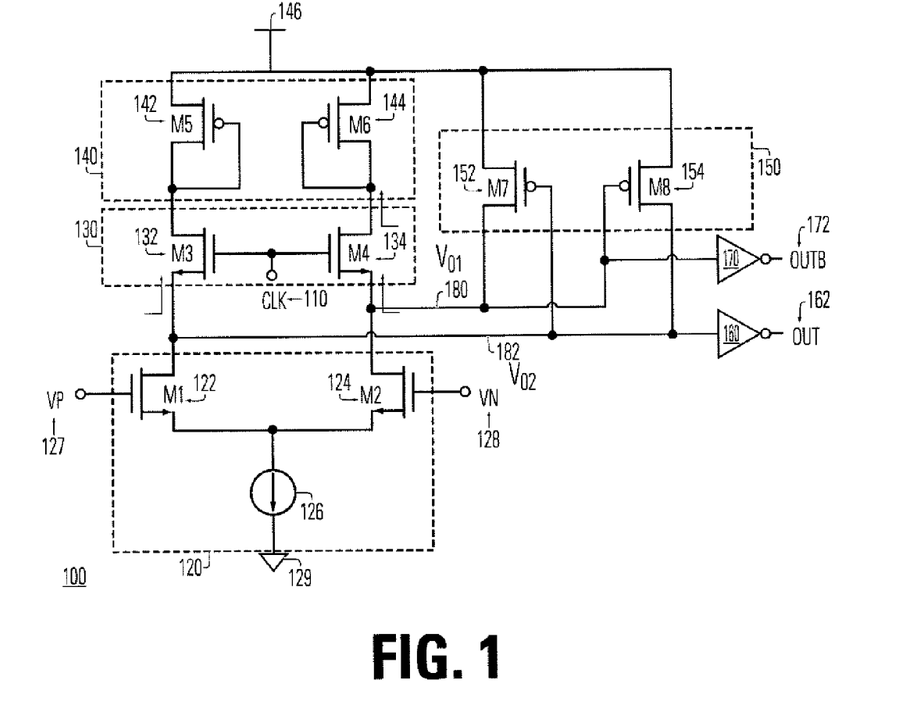
FIG. 1 is a circuit diagram illustrating a first embodiment of a differential sense amplifier that functions as a preamplifier when the clock signal is set to a first signal level in accordance with the present invention.

Referring now FIG. 1, there is shown a circuit diagram illustrating a differential sense amplifier 100 that functions as a preamplifier when a clock (CLK) signal 110 is set to a first signal level. The differential sense amplifier 100 comprises a differential amplifier 120, a switch 130, a pair of diode-connected transistors 140, a positive feedback circuit 150, a first output inverter 160 and a second output inverter 170. In this operational mode, the clock signal 110 is set to the first signal level to turn on the switch 130 so that the differential sense amplifier 100 functions as the preamplifier where all transistors M1 122, M2 124, M3 132, M4 134, M5 142, M6 144, M7 152, and M8 154 as well as a current source 126 are turned on. The switch 130 includes the M3 transistor 132 and the M4 transistor 134 that are coupled, respectively, to the pair of diode-connected transistors M5 142 and M6 144 on the upper side, and the differential pair 120 on the lower side. The pair of diode-connected transistors M5 142 and M6 144 are PMOS (P-channel MOS) transistors. The positive feedback circuit 150 includes the M7 transistor 152 and the M8 transistor 154 that provide a positive feedback as part of the preamplifier. The differential pair 120 includes two NMOS (N-channel MOS) transistors the M1 transistor 122 and the M2 transistor 124 which are connected together and biased by the constant current source 126.

The clock signal 110 is commonly connected between a gate terminal of the M3 transistor 132 and a gate terminal of the M4 transistor 134. The M3 transistor 132 has its drain terminal commonly connected to a source terminal of the M5 transistor 142 and a gate terminal of the M5 transistor 142. The M4 transistor 134 has its drain terminal commonly connected to a source terminal of the M6 transistor 144 and a gate terminal of M6 transistor 144. The M5 transistor 142 has its drain terminal connected to a Vdd voltage 146. The M6 transistor 144 also has its drain terminal connected to the Vdd voltage 146. The M3 transistor 132 has its source terminal connected to a drain terminal of the M1 transistor 122. The M4 transistor 134 has its source terminal connected to a drain terminal of the M2 transistor 124. The M1 transistor 122 and the M2 transistor 124 receive differential inputs Vp 127 and Vn 128 such where a gate terminal of the M1 transistor 122 is connected to the positive voltage Vp 127 and a gate terminal of the M2 transistor 124 is connected to the negative voltage Vn 128. The current source 126 has an input that is commonly connected to a source terminal of the M1 transistor 122 and a source terminal of the M2 transistor 124, and an output that is connected to ground 129.

The positive feedback circuit 150 is designed with the M7 transistor 152 and the M8 transistor 154, which operates as part of the preamplifier when the clock signal 110 is set to a first signal level. The M7 transistor 152 has its source terminal connected to the source terminal of the M4 transistor 134, a gate terminal of the M8 transistor 154, and an input to the second inverter 170. The M8 transistor 154 has its source terminal connected to the source terminal of the M3 transistor 132, a gate terminal of the M7 transistor 152, and an input to the first inverter 160. The M7 transistor 152 has its drain terminal connected to the Vdd voltage 146. The M8 transistor 154 also has its drain terminal connected to the Vdd voltage 146. The second inverter 170 generates an output signal OUTB 172, and the first inverter 160 generates an output signal OUT 162. The output signal OUT 162 is a complimentary output signal that is inverted relative to the output signal OUTB 172, such that when the output signal OUTB 172 is high, the output signal OUT 162 is low, or when the output signal OUTB 172 is low, the output signal OUT 162 is high.

When the CLK signal 110 is asserted to the first signal level, the M3 and M4 transistors 132 and 134 are turned on where in turn the M3 transistor 132 turns on the M5 transistor 142 and the M4 transistor 134 turns on the M6 transistor 144. Each of the M5 transistor 142 and the M6 transistor 144 has its gate terminal connected to its source terminal so that each functions like a diode. The M3 transistor 132 is connected to the M5 transistor 142 in which the combination functions effectively like a small resistor. The M4 transistor 134 is connected to the M6 transistor 144 in which the combination effectively functions like a small resistor. In this configuration, the voltages relation between Vo1 180 and Vo2 182 remain stable because the loop gain is less than 1, represented mathematically as $V_{o1} - V_{o2} \approx 10 \ast (VP - VN)$.

Figure 2:
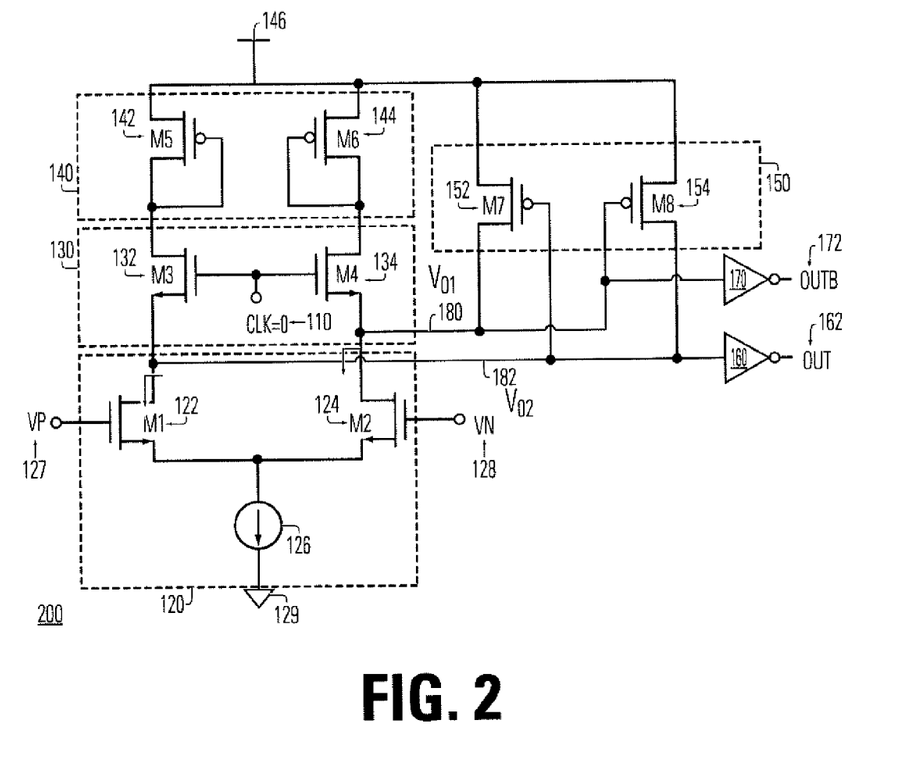
FIG. 2 is a circuit diagram illustrating the differential sense amplifier in the first embodiment that functions as a latch circuit when the clock signal is set to a second signal level in accordance with the present invention.

As shown in FIG. 2, there is shown a circuit diagram illustrating a differential sense amplifier 200 that functions as a latch circuit when the clock signal is set to a second signal level. When the clock signal is asserted to the second signal level, the switch circuit 130 is an off state in which the M3 transistor 132 and the M4 transistor 134 are both turned off, which in turn also turn off the M5 transistor 142 and the M6 transistor 144. All four transistors, M3 132, M4 134, M5 142 and M6 144, are in a lighter shade to indicate that they are in an off state. The remaining portions of the differential sense amplifier 200 that are active include the differential pair 120 and the latch circuit 150, as well as the output inverters 160 and 170. The differential sense amplifier 200 effectively functions as a latch circuit. In the preamplifier described above with respect to FIG. 1, the M3 132, M4 134, M5 142 and M6 144 transistors are turned on such that the M3 132 and M5 142 transistors function as a small resistor, and the M4 134 and M6 144 transistors function as a small resistor. However, in the operational mode that the differential sense amplifier 200 functions as the latch circuit, the small resistor value from the M3 132 and M5 142 transistors are no longer present in the differential sense amplifier 200 when the clock signal 110 is set to the second signal level. Similarly, the small resistor value from the M4 134 and M6 144 transistors are no longer present in the differential sense amplifier 200 when the clock signal 110 is set to the second signal level. Without the small resistors in parallel, the total output resistance would become larger, which results in a full loop gain (from the M1 122, M2 124, M7 152 and M8 154 transistors) greater than 1. At this juncture, the voltage difference of $V_{o1}$ 180 and $V_{o2}$ 182 would have a larger value depending on the relation of last stage given that the loop gain is greater 1.

Table 1 below summarizes a matrix of functions and the operational states of transistors for a clock signal that is set to the first signal level, which in this instance is one, and the clock signal is set to the second signal level, which in this instance is zero.

TABLE 1

| CLK | MOS Status | Function |
| --- | --- | --- |
| "1" | M1-M8 are turned ON | Preamplifier (Pre-Charge) |
| "0" | M3-M6 are OFF; M1, M2, M7, M7 are ON | Latch |

Figure 3:
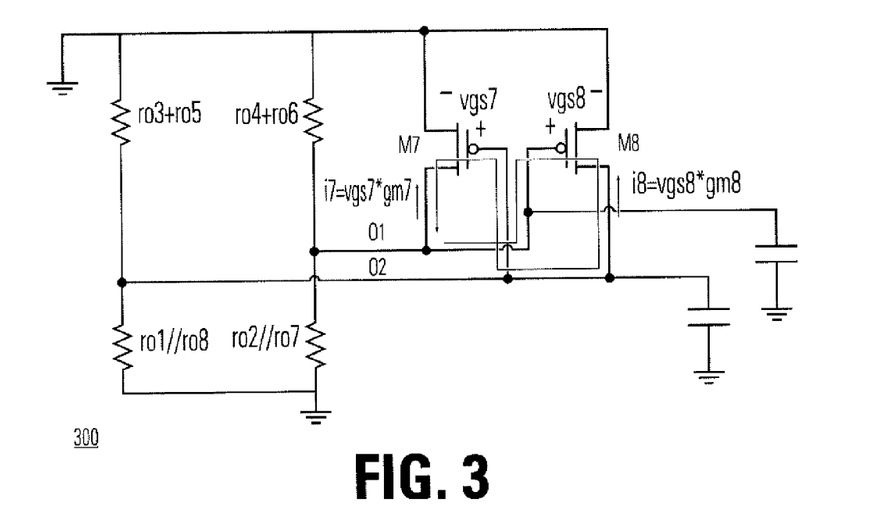
FIG. 3 is a circuit diagram illustrating the loop gain in the differential sense amplifier with respect to the first embodiment that functions as the preamplifier in accordance with the present invention.

In FIG. 3, there is shown a circuit diagram illustrating the loop gain in the differential sense amplifier 100 in the first embodiment that functions as the preamplifier when the clock signal is set to the first signal level. In this configuration, when the clock signal is set to the first signal level, the M3 transistor 132 and the M4 134 transistor are turned on, which also turn on the M5 142 transistor and the M6 144 transistor. The loop gain for the differential sense amplifier 100 that functions as an preamplifier can be calculated as follows:

$$A_{loop}=g_{m8}[(ro3+ro5)//(ro1//ro8)]*g_{m7}*[(ro4+ro6)//(ro2//ro7)]<1$$

$$\approx g_{m8}*[ro3+ro5]*g_{m7}*[(ro4+ro6)]<1$$

$$\because (ro1//ro8)>>(ro3+ro5); (ro2//ro7)>>(ro4+ro6)$$

$$\because g_{m8}*[ro3+ro5]=g_{m7}*[(ro4+ro6)]$$

$$\because ro4=1/gm4; ro6=1/gm6$$

$$\therefore \text{The equation conforms to } g_{m7}*(ro4+ro6)<1 32 > g_{m7}*(1/gm4+1/gm6)<1$$

Figure 4:
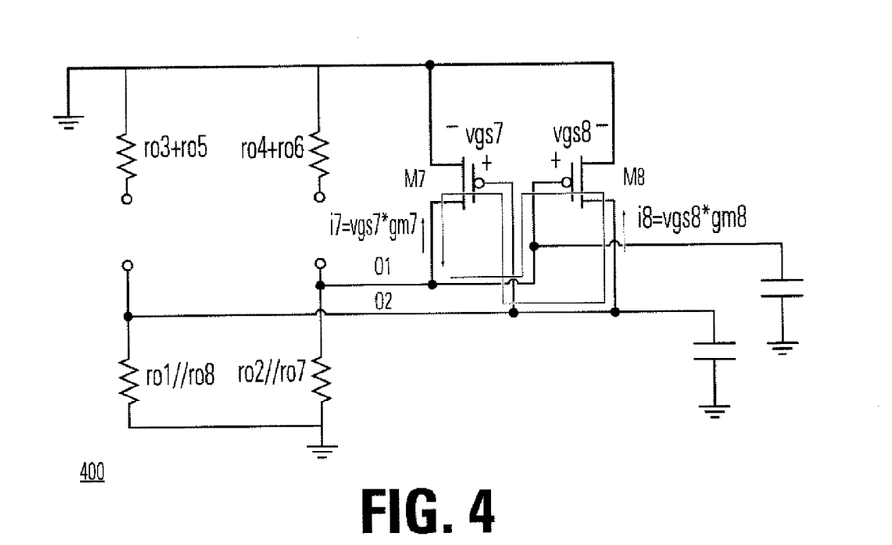
FIG. 4 is a circuit diagram illustrating the loop gain in the differential sense amplifier with respect to the first embodiment that functions as the latch circuit in accordance with the present invention.

FIG. 4 is a circuit diagram illustrating the loop gain in the differential amplifier 200 in the first embodiment that functions as the latch circuit when the clock signal is set to the second signal level. In this configuration, when the clock signal is set to the second signal level, the M3 132 transistor and the M4 134 transistor are turned off, which effectively leave an open circuit between the M1 122 transistor and the M5 142 transistor, as well as an open circuit between the M2 124 transistor and the M6 144 transistor. The loop gain for the differential sense amplifier 200 that functions as a latch can be calculated as follows:

$$A_{loop}=g_{m8}*(ro1//ro8)*g_{m7}*(ro2//ro7)>>1$$

Figure 5:
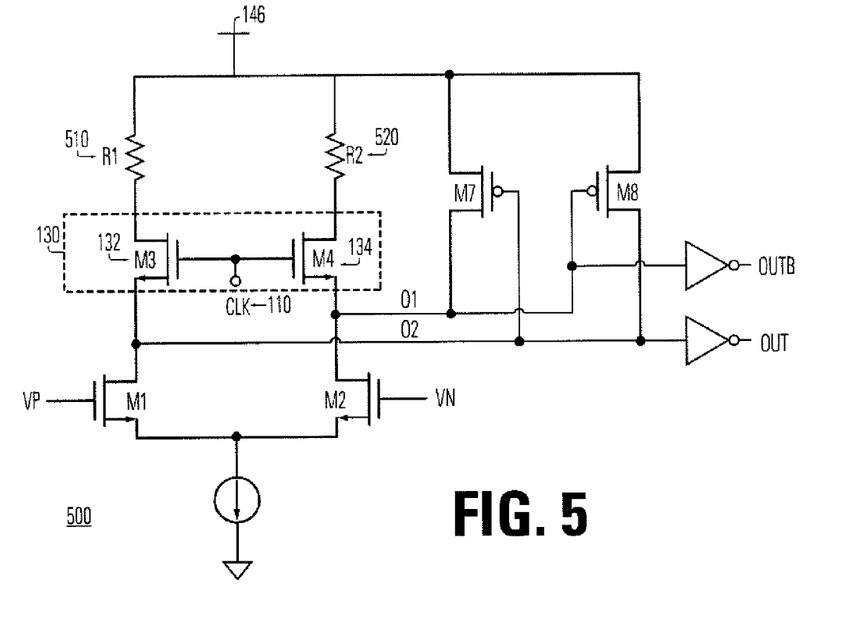
FIG. 5 is a circuit diagram illustrating a second embodiment of a differential sense amplifier that functions as a preamplifier when the clock signal is set to a first signal level in accordance with the present invention.

Turning now to FIG. 5, there is shown a circuit diagram illustrating a second embodiment of a differential sense amplifier 500 that functions as a preamplifier when the clock signal is set to the first signal level and that functions as a latch circuit when the clock signal is set to the second signal level. In this embodiment, the differential sense amplifier 500 is designed with a R1 resistor 510 connected between the M3 transistor 132 and the Vdd voltage 146, replacing the M5 142 transistor. A R2 resistor 520 is connected between the M4 transistor 134 and the Vdd voltage 146, replacing the M6 144 transistor. In this embodiment, the differential sense amplifier 500 with the R1 resistor 510 and the R2 resistor 520 provides a larger input common mode range relative to the differential sense amplifier 100 as described in FIG. 1.

Figure 6:
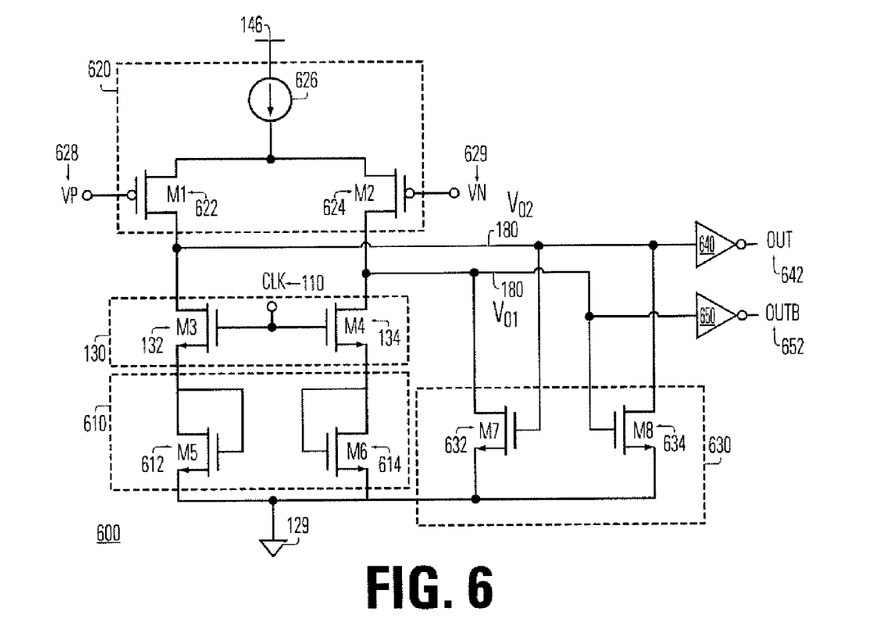
FIG. 6 is a circuit diagram illustrating a third embodiment of a differential sense amplifier that functions as a preamplifier when the clock signal is set to a first signal level in accordance with the present invention.

As shown in FIG. 6, there is a circuit diagram illustrating a third embodiment of a differential sense amplifier 600 that functions as a preamplifier when the clock signal is set at the first signal level and that functions as a latch when the clock signal is set at the second signal level. The PMOS transistors 142 and 144 in FIG. 1 are replaced with NMOS transistors to generate the configuration in FIG. 6. The differential sense amplifier 600 comprises a pair of diode-connected transistors 610, the switch circuit 130, a differential amplifier 620, a positive feedback circuit 630, a first output inverter 640 and a second output inverter 650. The switch 130 includes the M3 transistor 132 and the M4 transistor 134 that are coupled, respectively, to the pair of diode-connected M5 transistor 612 and M6 transistor 614 on the lower side, and the differential pair 620 on the upper side. The positive feedback circuit 630 includes a M7 transistor 632 and a M8 transistor 634 that provide a positive feedback to the preamplifier when the clock signal 110 is set at the first signal level, or serves as the latch circuit when the clock signal 110 is asserted is set at the second signal level. In the differential pair 620, a M1 transistor 622 and a M2 transistor 624 are connected together and biased by a constant current source 626.

The clock signal 110 is connected commonly between the gate terminal of the M3 transistor 132 and the gate terminal of the M4 transistor 134. The M3 transistor has its source terminal connected commonly to a drain terminal of the M5 transistor 612 and a gate terminal of the M5 transistor 612. The M4 transistor has its source terminal commonly connected to a drain terminal of the M6 transistor 614 and a gate terminal of the M6 transistor 614. The M5 transistor 612 and the M6 transistor 614 have their respective source terminals connected to ground 129. The M3 transistor 132 has its drain region connected to a source terminal of the M1 transistor 622. The M4 transistor 134 has its drain terminal connected to a source terminal of the M2 transistor 624. The current source 626 has an input connected to the Vdd 146 and an output commonly connected to a drain region of the M1 transistor 622 and a drain region of the M2 transistor 624. The M1 transistor 622 and the M2 transistor 624 receive differential inputs of Vp 628 and Vn 629 where a gate terminal of the M1 transistor 622 is connected to the positive Vp voltage 628 and a gate terminal of the M2 transistor 624 is connected to the negative voltage Vn 629.

The positive feedback circuit 630 is designed with a M7 transistor 632 and a M8 transistor 634, which operate as part of the preamplifier when the clock signal 110 is set to the first signal level and operates as the latch when the clock signal 110 set to the second signal level. The M7 transistor 632 has its drain terminal connected to the drain terminal of the M4 transistor 134, the source terminal of the M2 transistor 624, a gate terminal of the M8 transistor 634, and an input to the inverter 650. The M8 transistor 634 has its drain terminal connected to the drain terminal of the M3 transistor 132, the source terminal of the M1 transistor 622, a gate terminal of the M7 transistor 632, and an input to the output inverter 640. Source terminals of the M7 transistor 632 and the M8 transistor 634 are connected to ground 129. The first inverter 640 generates an output signal OUT 642, and the second inverter 650 generates an output signal OUTB 652. The output signal OUTB 652 is a complimentary output signal that is inverted relative to the output signal OUT 642, such that when the output signal OUTB 652 is high, the output signal OUT signal 642 is low, or when the output signal OUTB 652 is low, the output signal OUT signal 642 is high.

Figure 7:
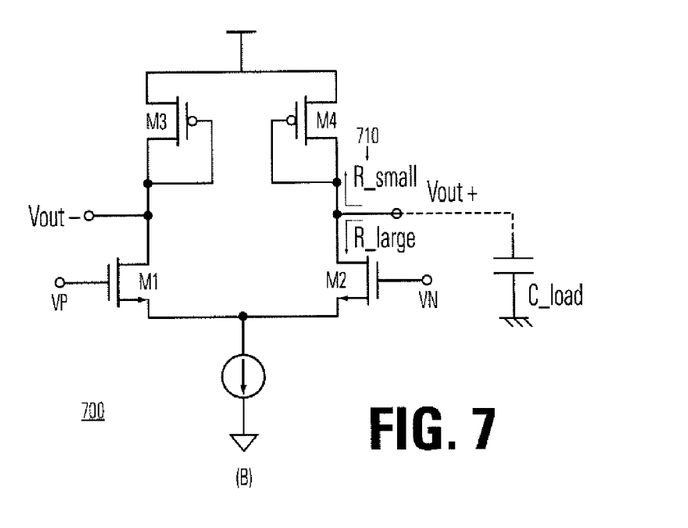
FIG. 7 is a circuit diagram illustrating a resistor-capacitor (RC) delay in the differential sense amplifier in accordance with the present invention.

Referring now FIG. 7, there is a circuit diagram illustrating a resistor-capacitor (RC) delay in the differential sense amplifier 700. In a conventional amplifier, there is a tradeoff between precision and speed where the precision could be high while the speed is low or vice versa. In the amplifier 700, a latch (not shown) is provided, as illustrated in FIG. 1, at the output so that a resistance R 710 is a small value, rather than a large resistance. The effect of adding a latch at the output of the amplifier produces high precision while maintaining the speed of the amplifier 700.

Figure 8:
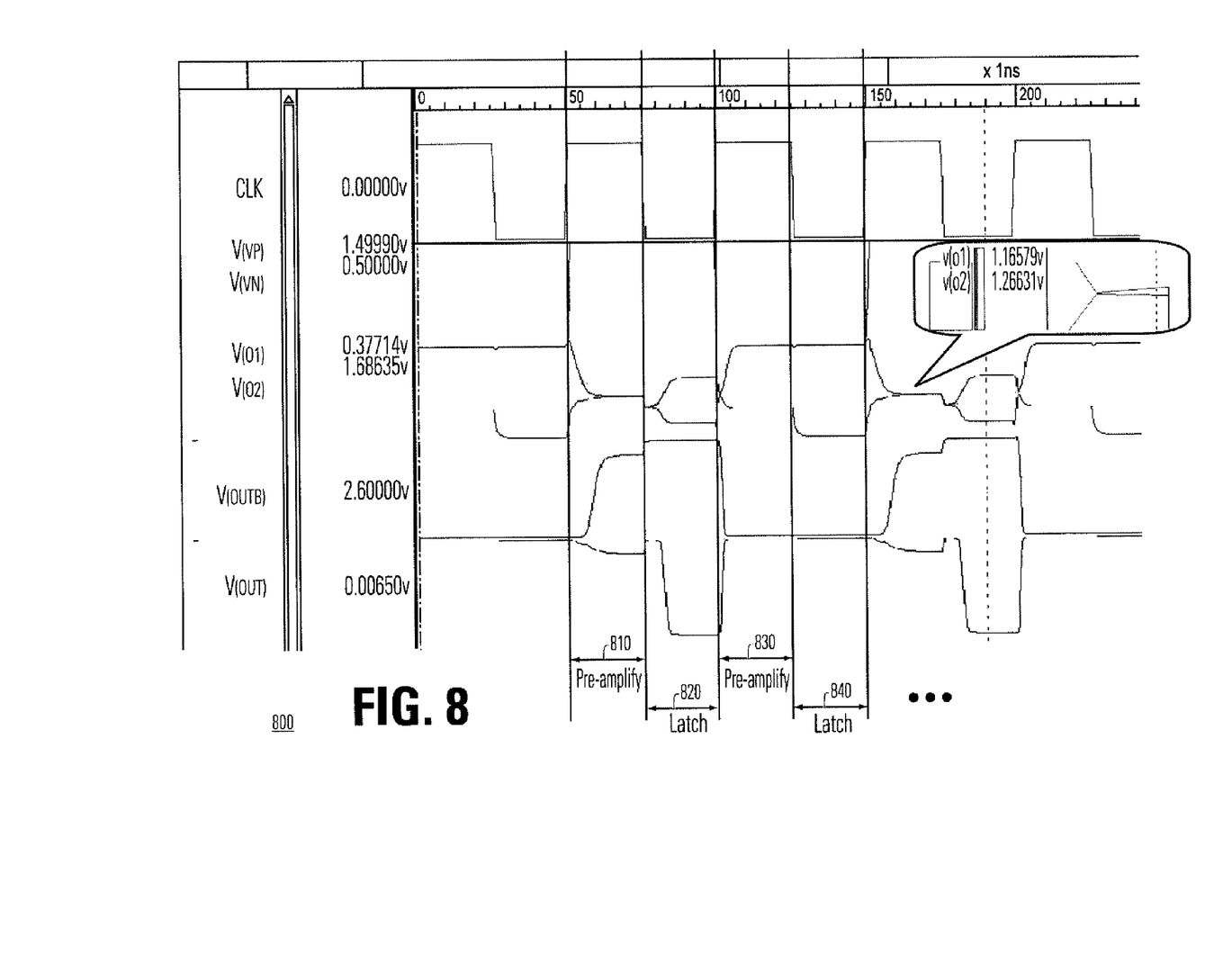
FIG. 8 is a waveform diagram illustrating signal voltages in the differential sense amplifier during read operations in accordance with the present invention.

A waveform 800 illustrating signal voltages in the differential sense amplifier 100 during read operations in shown in FIG. 8. During a first read operation, the differential sense amplifier 100 functions first as a preamplifier 810 and then as a latch 820. During a second read operation, the differential sense amplifier 100 function as a preamplifier 830 and as a latch 840.

The first signal level and the second level signal level of the clock signal 110 can be designated depending on a selected design. In one embodiment, the first signal level has a binary value of 1 and the second signal level signal has a binary value of 0. In another embodiment, the first signal level has a binary value of 0->1 and the second signal level has a binary value of 1->0.

The invention has been described with reference to specific exemplary embodiments. Various modifications, adaptations, and changes may be made without departing from the spirit and scope of the invention. Although the present invention illustrates three different embodiments in designing a switch circuit triggered by a clock signal with various positions of a differential pair, a pair of diode-connected transistors, and a latch circuit, one of skill in the art should recognize that other types of similar or equivalent circuits can be combined with the switch circuit without departing from the spirits of the present invention. Accordingly, the specification and drawings are to be regarded as illustrative of the principles of this invention rather than restrictive, the invention is defined by the following appended claims.

We claim:

1. A differential sense amplifier comprising:
    a switch circuit having a transistor (M3) with a first conduction terminal, a control terminal, and a second conduction terminal and a transistor (M4) having a first conduction terminal, a control terminal, and a second conduction terminal, the control terminal of the M3 transistor connected to the control terminal of the M4 transistor;
    a clock signal connected between the control terminal of the M3 transistor and the control terminal of the M4 transistor, the clock signal having a first signal level and a second signal level, the differential sense amplifier configuring as a preamplifier when the clock signal is set to the first signal level, the differential sense amplifier configuring as a latch circuit when the clock signal is set to the second signal level;
    a first resistive element coupling the first conduction terminal of the M3 transistor to a first bias voltage;
    a second resistive element coupling the first conduction terminal of the M4 transistor to the first bias voltage; and
    a latch circuit including:
        a transistor (M7) having a first conduction terminal, a gate terminal and a second conduction terminal, the first conduction terminal of the M7 transistor connected to the first bias voltage; and
        a transistor (M8) having a first conduction terminal, a gate terminal and a second conduction terminal, the first conduction terminal of the M8 transistor connected to the first bias voltage, the gate terminal of the M8 transistor directly connected to the second conduction terminal of the M4 transistor and the second conduction terminal of the M7 transistor, the second terminal of the M8 transistor directly connected to the second conduction terminal of the M3 transistor and the gate terminal of the M7 transistor.

2. The differential sense amplifier of claim 1 wherein:
    the first resistive element comprises a diode-connected transistor (M5) having a first conduction terminal, a gate terminal, and a second conduction terminal, the first conduction terminal of the M5 transistor connected to the first bias voltage, the gate terminal of the M5 transistor connected to the second conduction terminal of the M5 transistor and the first conduction terminal of the M3 transistor; and
    the second resistive element comprises a diode connected transistor (M6) having a first conduction terminal, a gate terminal, and a second conduction terminal, the first conduction terminal of the M6 transistor connected to the first bias voltage, the gate terminal of the M6 transistor connected to the second conduction terminal of the M6 transistor and the first conduction terminal of the M4 transistor.

3. The differential sense amplifier of claim 2 further comprising a differential pair circuit including:
    a transistor (M1) having a first conduction terminal, a gate terminal and a second conduction terminal, the first conduction terminal of the M1 transistor connected to the second conduction terminal of the M3 transistor, the second conduction terminal of the M8 transistor, and the gate terminal of the M7 transistor, the gate terminal of the M1 transistor connected to a first input voltage;
    a transistor (M2) having a first conduction terminal, a gate terminal and a second conduction terminal, the first conduction terminal of the M2 transistor connected to the second conduction terminal of the M4 transistor, the second conduction terminal of the M7 transistor, and the gate terminal of the M8 transistor, the gate terminal of the M2 transistor connected to a second input voltage opposite that of the first input voltage; and
    a current source having an first terminal connected to the second conduction terminal of the M1 transistor and the second conduction terminal of the M2 transistor, and a second terminal connected to a second bias voltage.

4. The differential sense amplifier of claim 3 further comprising a first inverter having an inverter input and an inverter output, the inverter input connected to the second conduction terminal of the M4 transistor, the second conduction terminal of the M7 transistor and the gate terminal of the M8 transistor, the first inverter generating an inverted output signal to the inverter output from that at the inverter input.

5. The differential sense amplifier of claim 4 further comprising a second inverter having an inverter input and an inverter output, the inverter input of the second inverter connected to the second conduction terminal of the M3 transistor, the gate terminal of the M7 transistor and the second conduction terminal of the M8 transistor, the second inverter generating an output signal to the inverter output of the second inverter from that at the inverter input of the second inverter.

6. The differential sense amplifier of claim 1 wherein:
    the first resisitive element comprises a R1 resistor having a first terminal connected to the first bias voltage and a second terminal connected to the first conduction terminal of the M3 transistor; and
    the second resisitive element comprises a R2 resistor having a first terminal connected to the first bias voltage and a second terminal connected to the first conduction terminal of the M4 transistor.

7. The differential sense amplifier of claim 1 wherein the first signal level comprises a logic one.

8. The differential sense amplifier of claim 1 wherein the second signal level comprises a logic zero.

* * * * *